United States Patent [19]

Murtojarvi

[11] Patent Number: 5,678,224
[45] Date of Patent: Oct. 14, 1997

[54] MIXER CIRCUIT

[75] Inventor: Simo Murtojarvi, Salo, Finland

[73] Assignee: Nokia Mobile Phones Ltd., Salo, Finland

[21] Appl. No.: 695,184

[22] Filed: Aug. 1, 1996

Related U.S. Application Data

[63] Continuation of Ser. No. 309,951, Sep. 21, 1994, abandoned.

[30] Foreign Application Priority Data

Sep. 25, 1993 [GB] United Kingdom .................. 9319834

[51] Int. Cl.$^6$ ........................................... H04B 1/26
[52] U.S. Cl. ..................... 455/326; 455/327; 455/330; 455/333
[58] Field of Search ................. 455/313, 4, 317, 455/318, 319, 323, 326, 327, 330, 333; 327/355

[56] References Cited

U.S. PATENT DOCUMENTS

| | | | |
|---|---|---|---|
| 4,193,036 | 3/1980 | Cerny, Jr. et al. | 455/333 |
| 4,367,560 | 1/1983 | Hallford | 455/330 |
| 4,801,899 | 1/1989 | Ashida | 332/17 |
| 5,006,811 | 4/1991 | Kruger | 329/354 |
| 5,140,705 | 8/1992 | Kosuga | 455/326 |
| 5,153,536 | 10/1992 | Miller | 332/105 |
| 5,214,397 | 5/1993 | Miller | 332/105 |
| 5,231,364 | 7/1993 | Mucke | 332/105 |
| 5,311,151 | 5/1994 | Vaisanen | 332/105 |
| 5,357,221 | 10/1994 | Matero | 332/123 |
| 5,371,481 | 12/1994 | Tiittanen et al. | 332/103 |
| 5,379,458 | 1/1995 | Vaisanen | 455/330 |
| 5,446,422 | 8/1995 | Mattila et al. | 332/103 |
| 5,469,126 | 11/1995 | Murtojarvi | 332/105 |

FOREIGN PATENT DOCUMENTS

| | | | |
|---|---|---|---|
| 3409555 | 10/1984 | Germany | 455/333 |
| 0198207 | 8/1990 | Japan | 455/326 |
| 2 219 704 | 12/1989 | United Kingdom | H03D 7/14 |

OTHER PUBLICATIONS

"Broadbank Monolithic Single and Double Ring Active/Passive Mixers", Pavio, et al., IEEE 1988 Microwave and Millimeter–Wave Monolithic Circuits Symposium, pp. 71–73.

"Conventional and New Applications for the Quadrature IF Microwave Mixer" 176 Microwave Journal, vol. 26 (1983) Jan., No. 1, Dedha, MA, USA, pp. 99–109.

*Primary Examiner*—Reinhard J. Eisenzopf
*Assistant Examiner*—Thanh Le
*Attorney, Agent, or Firm*—Perman & Green, LLP

[57] ABSTRACT

The useful frequency range of an I/Q diode modulator is increased by adding two capacitors (15, 16) and an inductance (17), or two inductances and one capacitance, as a series-resonant circuit. The capacitors (15, 16) are connected in series and have a zero voltage at their connection point so that the inductance (17) does not influence the oscillator signal. The inductance (17) is chosen so that resonance occurs at the frequency at which leakage across the diodes would otherwise occur, so that the impedance between ground and the diode (4, 5) connection point is very low and, therefore, so is leakage between the mixer outputs. When the diode elements conduct, the voltage at the point between the diodes (4, 5 or 4a, 5a) is connected to both branches of the transformer (8) secondary so that the branches have equal voltages with the same phase. This permits an I/Q modulator or I/Q demodulator for 400 MHz or even 900 MHz frequency to be made with ordinary UHF mixer diodes.

14 Claims, 1 Drawing Sheet

MIXER CIRCUIT

This application is a continuation of application Ser. No. 08/309,951 filed on Sep. 21, 1994, abandoned.

BACKGROUND OF THE INVENTION

1. Field of the Invention

This invention relates to a mixer. In particular, it relates to a mixer circuit comprising an rf balancing device and at least one capacitative non-linear device coupled between the output terminals of the rf balancing device.

2. Discussion of Related Art

FIG. 1 of the accompanying drawings shows a circuit diagram of a circuit conventionally used as an I/Q modulator or I/Q demodulator.

The diagram shown in FIG. 1 is a prior art I/Q modulator described in European patent application No 92310775.9. The circuit comprises a rf transformer 8 and a diode bridge formed by four diodes 4, 5, 6, 7, a 90 degree power combiner 1 and two low pass filters respectively formed by capacitors 9, 11 and coils 10, 12.

The input signals 2 and 3 are coupled through the low pass filters to the diode bridge formed by diodes 4–7. The LO signal is coupled to the diode bridge through the rf transformer 8. The input signals 2 and 3 are respectively mixed with the LO signal in respective parts of the diode bridge.

The mixed signals 13 and 14 are then coupled to the 90 degree power combiner 1, which produces a combined MOD OUT signal as an output signal.

When using an I/Q modulator or an I/Q demodulator according to the circuit diagram shown in FIG. 1, the performance of the modulator deteriorates at frequencies above 100 MHz. This is due to signal leakage between nodes 18 and 19 of the mixer circuit through the capacitances of the mixer diodes. This causes modulated signals to sum and be combined prior to being coupled into the 90 degree power combiner 1.

In order to minimize the effect of the modulated signals being prematurely summed up or combined, the capacitances of the diodes should be as small as possible and the impedance between ground and the diode connection points on the transformer side should be as low as possible. Such a low impedance also reduces attenuation of the mixed signal.

The drawbacks to employing a conventional circuit as shown in FIG. 1 is that the low capacity diodes are rather expensive and the inductance of the transformer is in the range of nanohenries, which means it has an impedance of tens of ohms.

SUMMARY OF THE INVENTION

The present invention addresses and aims to alleviate at least some of the foregoing problems. According to the present invention,there is provided a mixer circuit comprising an r.f. balancing device having first and second output terminals and at least one capacitative non-linear device coupled between the first and second output terminals, a first impedance element coupled to the first output terminal and to a second impedance element coupled to the second output terminal, and a third impedance element coupled between ground and a common node of the first and second impedance elements, wherein the first impedance element and the third impedance element, and the second impedance element and the third impedance element respectively form a series resonant circuit at an operating frequency of the mixer circuit.

In a preferred embodiment of the invention at least one capacitative non-linear element comprises a pair of mixer diodes. This has the advantage that it is a common configuration for a mixer circuit and that the attenuation of such a mixer circuit is reduced.

Alternatively, the mixer forms a part of an I/Q modulator/demodulator and comprises a diode bridge formed by four diodes.

The capacitative non-linear device may be a field-effect transistor and suitable impedance elements include stripline or microstripline components.

BRIEF DESCRIPTION OF THE DRAWINGS

Embodiments of the present invention will now be described, by way of example only, and with reference to the accompanying drawings in which.

DETAILED DESCRIPTION OF PREFERRED EMBODIMENTS

Figure 1:
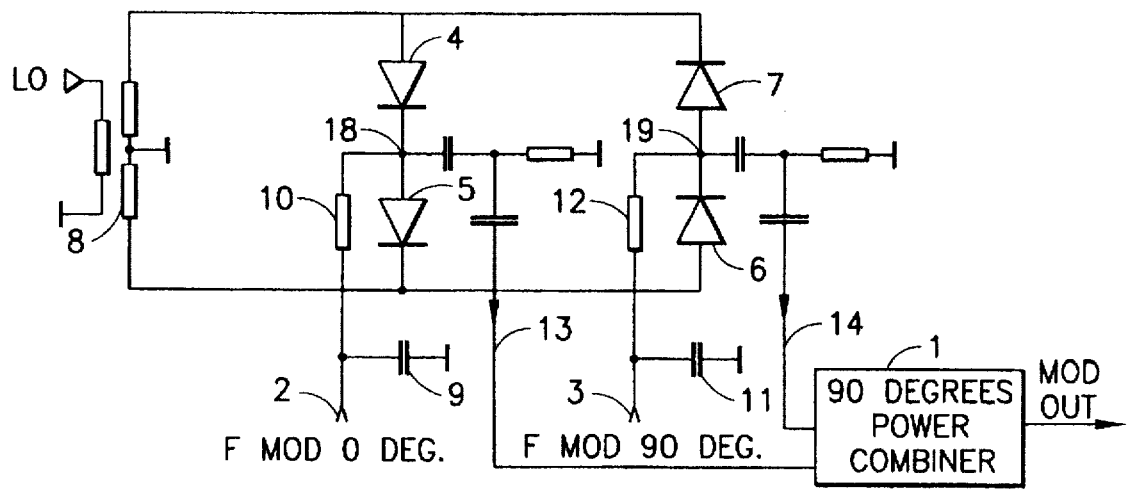
FIG. 1 is a circuit diagram of a known mixer circuit.
Figure 2:
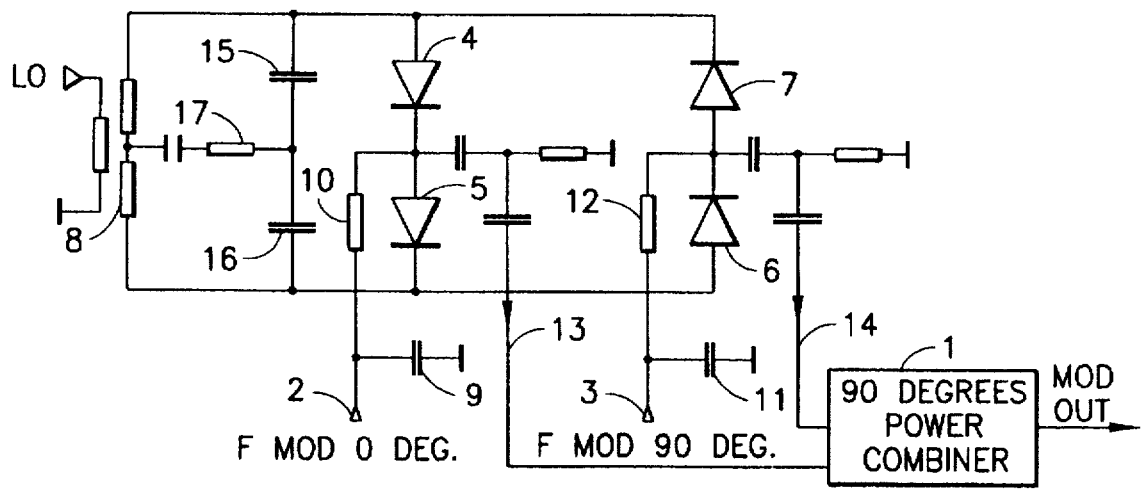
FIG. 2 is a circuit diagram of a first circuit in accordance with the present invention.

The diagram shown in FIG. 2 depicts a circuit in accordance with the present invention. The problem discussed above is addressed by adding two capacitors 15 and 16 and a coil 17 over the secondary of the transformer (rf balancing device 8) as shown in FIG. 2. As seen from the transformer secondary, the capacitors 15 and 16 are connected in series and have a zero voltage at their common connection point so that the coil 17 does not influence the oscillator signal.

When the diodes 4 and 5 are conductive, the voltage at the point between the diodes 4 and 5 is connected to the both branches of the transformer secondary. This means that the both branches have equal voltages with the same phase. To this voltage the capacitors 15 and 16 appear as if they are connected in parallel and the coil 17 also has a certain voltage.

The coil 17 is chosen so as to form a series resonance with the capacitors 15 and 16 respectively at the frequency where summing or combining of the input signals through the diodes 4 and 5 would otherwise occur. In this way the impedance between ground and the diode 4, 5 connection points on the transformer side is very low, so that the leakage between the mixer outputs stays very small.

Figure 3:
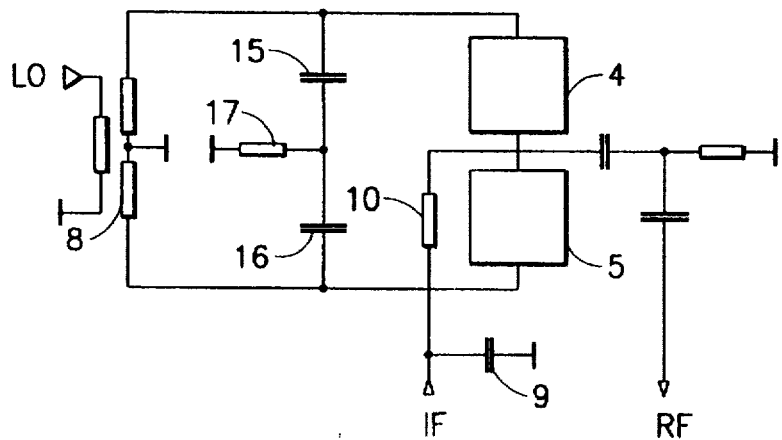
FIG. 3 is a circuit diagram of a second circuit in accordance with the present invention.

The diagram shown in FIG. 3 is a circuit diagram of a second embodiment of a circuit in accordance with the present invention. Here, the invention acts to reduce the mixing attenuation of an ordinary diode mixer. The smaller the mixing attenuation, the better the short-circuiting of the mixed signal to ground through the diode junction element 4a, 5a at the oscillator signal frequency.

With the help of the invention it is easy to realize an I/Q modulator or I/Q demodulator for 400 MHz or even 900 MHz frequencies with ordinary UHF mixer diodes. The same principle can be applied to minimize mixer attenuation in the diode mixer shown in FIG. 3.

In view of the foregoing description it will be evident to a person skilled in the art that various modifications may be made within the scope of the invention.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

I claim:

1. A mixer circuit comprising an r.f. balancing device having first and second output terminals and at least one capacitative non-linear device coupled between the first and second output terminals, a first impedance element coupled to the first output terminal and to a second impedance element coupled to the second output terminal, and a third impedance element coupled between ground and a common node of the first and second impedance elements, wherein the first impedance element and the third impedance element, and the second impedance element and the third impedance element respectively form a series resonant circuit that is tuned to an operating frequency of the mixer circuit and wherein an impedance between the first and second output terminals and ground decreases at the operating frequency.

2. A mixer circuit according to claim 1, wherein the at least one capacitative non-linear device comprises a pair of mixer diodes.

3. A mixer circuit according to claim 1, wherein the mixer circuit forms a part of an I/Q modulator/demodulator and comprises a diode bridge formed by four diodes.

4. A mixer circuit according to claim 1, wherein the at least one capacitative non-linear device comprises a field-effect transistor.

5. A mixer circuit according to claim 1, wherein the impedance elements comprise stripline or microstripline components.

6. A mixer circuit, comprising:

an r.f. transformer having a primary coupled to a local oscillator signal and a center-tapped secondary having first and second output terminals;

at least one capacitive non-linear device coupled at first and second nodes between said transformer secondary first and second output terminals, respectively, said at least one capacitive non-linear device further being coupled to at least one input r.f. signal that is to be combined with said local oscillator signal to generate an output signal having a desired frequency;

a first capacitance having a first node coupled to the first output terminal;

a second capacitance having a first node coupled to the second output terminal; and an inductance having a first node coupled to a second node of said first capacitance and to a second node of said second capacitance, said inductance having a second node coupled to ground; wherein the first capacitance and the inductance, and the second capacitance and the inductance, respectively, are selected to have values so as to form a series resonant circuit that is tuned to said desired frequency, wherein an impedance between the first and second output terminals and ground decreases at the desired frequency.

7. A mixer circuit as set forth in claim 6, wherein a combination of the first capacitance and the inductance, and the second capacitance and the inductance, respectively, reduces an impedance between ground and said first and second nodes of said capacitive non-linear device at said desired frequency.

8. A mixer circuit as set forth in claim 6, wherein a combination of the first capacitance and the inductance, and the second capacitance and the inductance, respectively, reduces a mixing attenuation of said mixer.

9. A mixer circuit as set forth in claim 6, wherein said at least one capacitive non-linear device comprises a pair of series connected mixer diodes.

10. A mixer circuit as set forth in claim 6, wherein said mixer circuit forms a part of an I/Q modulator/demodulator and comprises a diode bridge formed by four diodes.

11. A mixer circuit as set forth in claim 6, wherein said at least one capacitive non-linear device comprises a field-effect transistor.

12. A mixer circuit as set forth in claim 6, wherein said first and second capacitances, and said inductance, comprise stripline or microstripline components.

13. A mixer circuit, comprising:

an r.f. transformer having a primary coupled to a local oscillator signal and a center-tapped secondary having first and second output terminals;

at least one pair of series connected diodes coupled between said first and second output terminals, said pair of diodes further being coupled to at least one input r.f. signal that is to be combined with said local oscillator signal to generate an output signal having a desired frequency;

a first capacitance having a first node coupled to the first output terminal;

a second capacitance having a first node coupled to the second output terminal; and an inductance having a first node coupled to a second node of said first capacitance and to a second node of said second capacitance, said inductance having a second node coupled to ground; wherein the first capacitance and the inductance, and the second capacitance and the inductance, respectively, are selected to have values so as to form a series resonant circuit that is tuned to said desired frequency, wherein a combination of the first capacitance and the inductance, and the second capacitance and the inductance, respectively, reduces an impedance between ground and said first and second output terminals at the desired frequency.

14. A mixer circuit as set forth in claim 13, wherein said first and second capacitances, and said inductance, comprise stripline or microstripline components.

* * * * *